United States Patent
Forget et al.

(10) Patent No.: US 11,805,634 B2
(45) Date of Patent: Oct. 31, 2023

(54) TILT AND ROTATE DISPENSER HAVING MOTION CONTROL

(71) Applicant: Illinois Tool Works Inc., Glenview, IL (US)

(72) Inventors: Ronald J. Forget, Douglas, MA (US); Thomas J. Karlinski, Atkinson, NH (US); Scott A. Reid, Bradford, MA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 17/392,998

(22) Filed: Aug. 3, 2021

(65) Prior Publication Data
US 2023/0038567 A1  Feb. 9, 2023

(51) Int. Cl.
*B05C 5/02* (2006.01)
*B05C 11/10* (2006.01)
*H05K 13/04* (2006.01)
*H05K 13/08* (2006.01)

(52) U.S. Cl.
CPC ....... *H05K 13/0469* (2013.01); *B05C 5/0225* (2013.01); *B05C 11/1015* (2013.01); *H05K 13/0815* (2018.08); *H05K 2203/0126* (2013.01)

(58) Field of Classification Search
None
See application file for complete search history.

(56) References Cited

U.S. PATENT DOCUMENTS

| 3,709,190 A | * | 1/1973 | Von Gottberg | B05B 13/0452 |
| | | | | 901/17 |
| 4,564,410 A | | 1/1986 | Clitheros et al. | |
| 5,348,585 A | * | 9/1994 | Weston | H05K 13/0469 |
| | | | | 118/410 |

(Continued)

FOREIGN PATENT DOCUMENTS

WO    2021211239 A1    10/2021

OTHER PUBLICATIONS

International Search Report and Written Opinion from International Application No. PCT/US2022/030890 dated Sep. 8, 2022.

(Continued)

*Primary Examiner* — Jethro M. Pence
(74) *Attorney, Agent, or Firm* — Lando & Anastasi, LLP

(57) ABSTRACT

A dispensing system includes a frame, a support coupled to the frame, a dispensing unit configured to dispense viscous material, and a gantry assembly coupled to the frame. The gantry assembly includes a gantry configured to support the dispensing unit and to move the dispensing unit in x-axis, y-axis and z-axis directions and a tilt and rotate subassembly configured to tilt and rotate the dispensing unit. The dispensing system further includes a controller configured to control dispensing unit and the gantry assembly to perform a dispense operation on the electronic substrate. The controller is configured to simultaneously coordinate the movement of the gantry assembly and the tilt and rotate subassembly to position and orient the nozzle of the dispensing unit a predetermined distance and orientation from the electronic substrate while dispensing material along a three-dimensional path.

17 Claims, 9 Drawing Sheets

(56) References Cited

U.S. PATENT DOCUMENTS

| | | | | |
|---|---|---|---|---|
| 6,001,181 | A * | 12/1999 | Bullen | B05C 5/0216 118/679 |
| 6,248,175 | B1 * | 6/2001 | Subramanian | H01L 21/6715 118/712 |
| 6,494,400 | B1 * | 12/2002 | Zitella | B65B 11/02 242/559.3 |
| 7,011,382 | B2 * | 3/2006 | Holm | B23K 3/0607 347/19 |
| 7,229,145 | B2 * | 6/2007 | Holm | H05K 13/0469 347/19 |
| 7,404,861 | B2 * | 7/2008 | Prentice | H05K 13/081 118/305 |
| 7,963,246 | B1 * | 6/2011 | Brinker | B05C 5/0216 118/712 |
| 7,980,197 | B2 * | 7/2011 | Prentice | H01L 21/67005 118/263 |
| 8,086,360 | B2 | 12/2011 | Hilmersson | |
| 8,136,705 | B2 * | 3/2012 | Tracy | F04B 17/03 222/311 |
| 8,176,870 | B2 * | 5/2012 | Ikushima | H01L 51/0004 118/305 |
| 8,424,720 | B2 * | 4/2013 | Tracy | F04B 17/00 222/1 |
| 8,757,449 | B2 * | 6/2014 | Ikushima | B05C 5/0225 222/542 |
| 9,010,910 | B2 * | 4/2015 | Crouch | B41J 2/045 347/73 |
| 9,039,146 | B2 * | 5/2015 | Crouch | H05K 3/0091 347/73 |
| 9,089,863 | B2 * | 7/2015 | Crouch | B05B 15/555 |
| 9,156,054 | B2 * | 10/2015 | Ikushima | B41J 2/04556 |
| 9,393,787 | B2 * | 7/2016 | Ikushima | B05C 11/1034 |
| 9,701,143 | B2 * | 7/2017 | Ikushima | B41J 2/1433 |
| 10,150,131 | B2 * | 12/2018 | Giusti | B05B 12/124 |
| 10,556,207 | B2 * | 2/2020 | Ikushima | B05D 1/26 |
| 10,603,684 | B2 * | 3/2020 | Zenou | B05C 5/0279 |
| 10,766,042 | B1 * | 9/2020 | Brinker | B05C 5/0204 |
| 10,799,906 | B2 * | 10/2020 | Ikushima | B05D 1/26 |
| 10,898,921 | B2 * | 1/2021 | Zenou | B05C 5/0225 |
| 11,229,923 | B2 * | 1/2022 | Ikushima | H01L 21/6715 |
| 11,246,249 | B2 | 2/2022 | Prentice et al. | |
| 11,266,957 | B2 * | 3/2022 | Ikushima | B01F 25/104 |
| 11,440,047 | B2 * | 9/2022 | Zenou | B05D 1/40 |
| 2007/0146442 | A1 * | 6/2007 | Holm | B23K 3/0623 347/84 |
| 2009/0317554 | A1 | 12/2009 | Christensen et al. | |
| 2010/0330144 | A1 * | 12/2010 | Liu | B05B 13/0442 428/36.1 |
| 2011/0253741 | A1 * | 10/2011 | Prentice | B05C 5/0225 222/1 |
| 2014/0060144 | A1 * | 3/2014 | Bloom | H05K 3/3485 73/1.01 |
| 2014/0093638 | A1 * | 4/2014 | Bloom | H05K 3/00 118/713 |
| 2014/0272109 | A1 * | 9/2014 | Martensson | B41J 2/14 239/536 |
| 2015/0093498 | A1 * | 4/2015 | Reid | H05K 3/0085 118/712 |
| 2016/0158786 | A1 | 6/2016 | Christensen | |
| 2017/0333936 | A1 | 11/2017 | Gibson et al. | |

OTHER PUBLICATIONS

International Search Report and Written Opinion from International Application No. PCT/US2022/030908 dated Sep. 6, 2022.

* cited by examiner

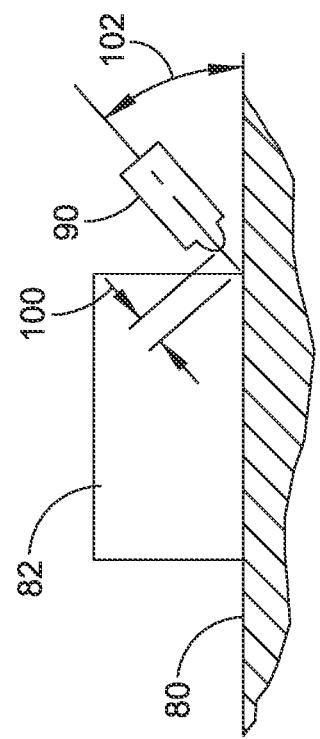
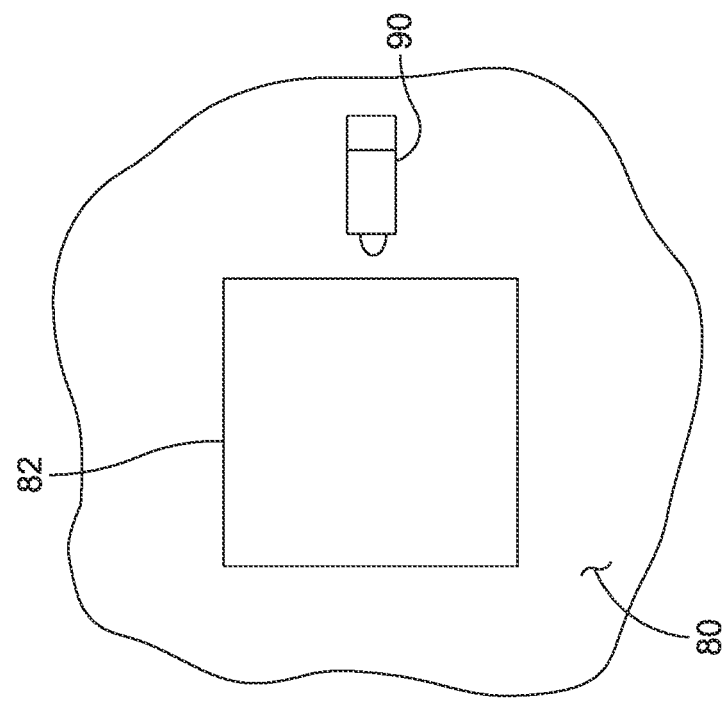

TILT AND ROTATE DISPENSER HAVING MOTION CONTROL

RELATED APPLICATION

This application relates to U.S. patent application Ser. No. 17/393,003 titled "TILT AND ROTATE DISPENSER HAVING MATERIAL FLOW RATE CONTROL," filed on Aug. 3, 2021, which is incorporated herein by reference in their entirety for all purposes.

BACKGROUND OF THE DISCLOSURE

1. Field of the Disclosure

This disclosure relates generally to apparatus and methods for dispensing a viscous material on a substrate, such as a printed circuit board, and more particularly to a method and an apparatus for dispensing material on a substrate with a mechanism configured to tilt and rotate a dispensing unit.

2. Discussion of Related Art

There are several types of dispensing systems used for dispensing precise amounts of liquid or paste for a variety of applications. One such application is the assembly of integrated circuit chips and other electronic components onto circuit board substrates. In this application, automated dispensing systems are used for dispensing dots of liquid epoxy or solder paste, or some other related material, onto printed circuit boards. Automated dispensing systems are also used for dispensing lines of underfill materials and encapsulants, which may be used to mechanically secure components to the printed circuit board. Exemplary dispensing systems described above include those manufactured and distributed by Illinois Tool Works Electronic Assembly Equipment (ITWEAE), with offices at Hopkinton, Massachusetts.

In a typical dispensing system, a dispensing unit is mounted to a moving assembly or gantry for moving the dispensing unit along three mutually orthogonal axes (x-axis, y-axis, and z-axis) using servomotors controlled by a computer system or controller. To dispense a dot of liquid on a printed circuit board or other substrate at a desired location, the dispensing unit is moved along the co-planar horizontal x-axis and y-axis directions until the dispensing unit is located over the desired location. The dispensing unit is then lowered along the perpendicularly oriented vertical z-axis direction until a nozzle/needle of the dispensing unit and dispensing system is at an appropriate dispensing height over the substrate. The dispensing unit dispenses a dot of liquid, is then raised along the z-axis, moved along the x- and y-axes to a new location, and is lowered along the z-axis to dispense the next liquid dot. For applications such as encapsulation or dispensing of underfill as described above, the dispensing unit is typically controlled to dispense lines of material as the dispensing unit is moved in the x- and y-axes along the desired path of the lines. For some types of dispensing units, such as jetting pumps, the z-axis movement prior to and subsequent to a dispense operation may not be required.

Greater control of the dispensing unit to accurately place dispensed material closer to a corner where a component edge meets the substrate or other space/orientation that requires such motion is desired.

SUMMARY OF THE DISCLOSURE

One aspect of the present disclosure is directed to a dispensing system for dispensing viscous material on an electronic substrate. In one embodiment, the dispensing system comprises a frame, a support coupled to the frame, the support being configured to receive and support an electronic substrate during a dispense operation, and a dispensing unit configured to dispense viscous material, the dispensing unit having a nozzle. The dispensing system further comprises a gantry assembly coupled to the frame, with the gantry assembly including a gantry configured to support the dispensing unit and to move the dispensing unit in x-axis, y-axis and z-axis directions and a tilt and rotate subassembly configured to tilt and rotate the dispensing unit. The dispensing system further comprises a controller configured to control dispensing unit and the gantry assembly to perform a dispense operation on the electronic substrate. The controller is configured to simultaneously coordinate the movement of the gantry assembly and the tilt and rotate subassembly to position and orient the nozzle of the dispensing unit a predetermined distance and orientation from the electronic substrate while dispensing material along a three-dimensional path.

Embodiments of the dispensing system further may include positioning the nozzle from the electronic substrate a predetermined distance up to 5.0 mm. The controller further may be configured to maintain the nozzle of the dispensing unit a predetermined angle with respect to a horizontal plane of the electronic substrate. The predetermined angle may be between 0° and 90°. The controller further may be configured to move the nozzle of the dispensing unit at a constant speed with respect to the package. The constant speed may be up to 1000 mm/second. The controller further may be configured to dispense material from the nozzle of the dispensing unit at a flow rate configured to deposit a desired amount or density of material on the electronic substrate. The flow rate may be up to 2000 mg/sec. The tilt and rotate subassembly may be configured to tilt the dispensing unit up to 3600 and to rotate the dispensing unit up to 360°. The dispensing system further may include a vision system coupled to one of the frame and the gantry assembly to capture at least one image of the electronic substrate. The controller further may be configured to control the vision system. The controller further may be configured to calibrate the dispense location of a nozzle of the dispensing unit with respect to the vision system by dispensing on the electronic substrate provided on the support. The controller may include or have access to a database having a table of nozzle to vision system orientations. The controller may be configured to calibrate the orientation of the nozzle based on in part an interpolation of known positions and orientations.

Another aspect of the present disclosure is directed to a method of dispensing viscous material on an electronic substrate. In one embodiment, the method comprises: delivering an electronic substrate to a dispense position; capturing at least one image of the electronic substrate; analyzing the at least one image of the electronic substrate to determine a position of the electronic substrate; and performing a dispense operation by moving, tilting and rotating a dispensing unit coupled to a gantry configured to support the dispensing unit and to move the dispensing unit in x-axis, y-axis and z-axis directions and a tilt and rotate subassembly configured to tilt and rotate the dispensing unit. Performing the dispense operation includes simultaneously coordinating the movement of a gantry assembly and a tilt and rotate subassembly to position and orient a nozzle of the dispensing unit a predetermined distance and orientation from the electronic substrate while dispensing material along a three-dimensional path.

Embodiments of the method further may include maintaining the nozzle of the dispensing unit a predetermined angle with respect to a horizontal plane of the electronic substrate. Performing the dispense operation may include moving the nozzle of the dispensing unit at a constant speed with respect to the package. Performing the dispense operation may include dispensing material from the nozzle of the dispensing unit at a flow rate configured to deposit a desired amount or density of material on the electronic substrate. The method further may include calibrating the dispense location of a nozzle of the dispensing unit with respect to the vision system of the dispenser by dispensing on the electronic substrate provided on the support. The controller may include or have access to a database having a table of nozzle to vision system orientations.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIG. 7A is an exemplary package mounted on an electronic substrate;

FIG. 7B is an exemplary package mounted on an electronic substrate;

DETAILED DESCRIPTION OF THE DISCLOSURE

Figure 1:
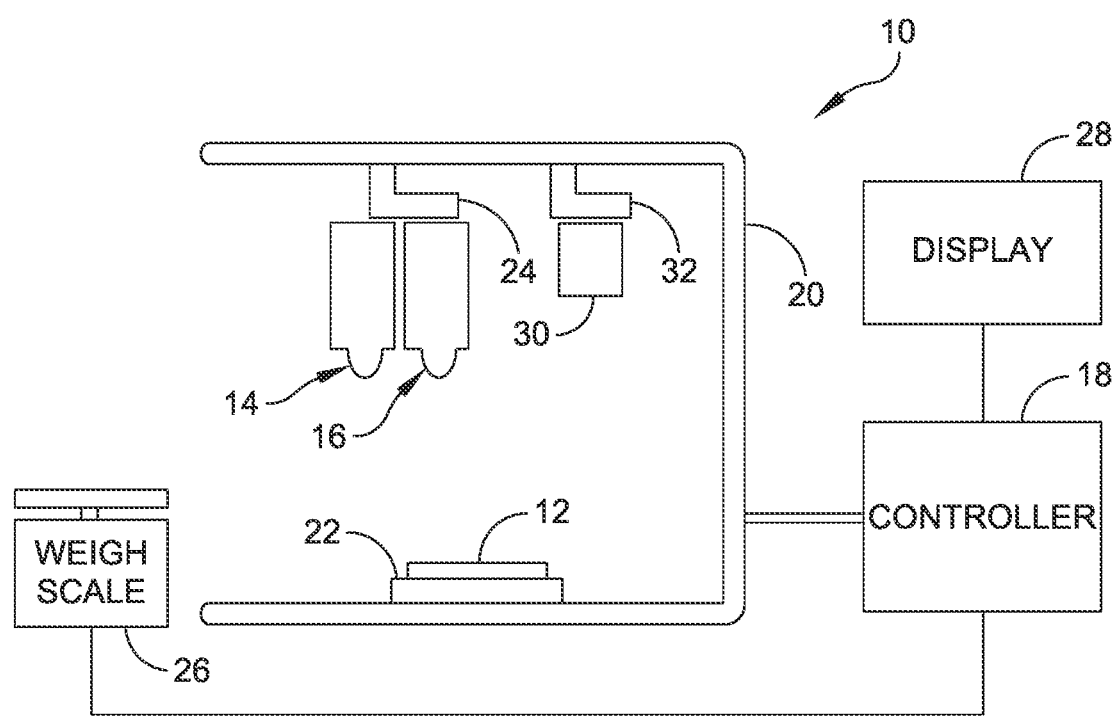
FIG. 1 is a schematic view of a dispensing system.

Various embodiments of the present disclosure are directed to viscous material dispensing systems, devices including dispensing systems. Embodiments disclosed herein are directed to techniques for dispensing material on an electronic substrate by a dispensing system having a dispensing unit that is configured to tilt and rotate to dispense material onto the electronic substrate.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

FIG. 1 schematically illustrates a dispensing system, generally indicated at 10, according to one embodiment of the present disclosure. The dispensing system 10 is used to dispense a viscous material (e.g., an adhesive, encapsulant, epoxy, solder paste, underfill material, etc.) or a semi-viscous material (e.g., soldering flux, etc.) onto an electronic substrate 12, such as a printed circuit board or semiconductor wafer. The dispensing system 10 may alternatively be used in other applications, such as for applying automotive gasketing material or in certain medical applications or for applying conductive inks. It should be understood that references to viscous or semi-viscous materials, as used herein, are exemplary and intended to be non-limiting. In one embodiment, the dispensing system 10 includes first and second dispensing units, generally indicated at 14 and 16, respectively, and a controller 18 to control the operation of the dispensing system. It should be understood that dispensing units also may be referred to herein as dispensing pumps and/or dispensing heads. Although two dispensing units are shown, it should be understood that a single dispensing unit or multiple dispensing can be employed.

The dispensing system 10 may also include a frame 20 having a base or support 22 for supporting the electronic substrate 12, a dispensing unit gantry 24 movably coupled to the frame 20 for supporting and moving the dispensing units 14, 16, and a weight measurement device or weigh scale 26 for weighing dispensed quantities of the viscous material, for example, as part of a calibration procedure, and providing weight data to the controller 18. A conveyor system (not shown) or other transfer mechanism, such as a walking beam, may be used in the dispensing system 10 to control loading and unloading of electronic substrates to and from the dispensing system. The gantry 24 can be moved using motors under the control of the controller 18 to position the dispensing units 14, 16 at predetermined locations over the electronic substrate. The dispensing system 10 may include a display unit 28 connected to the controller 18 for displaying various information to an operator. There may be an optional second controller for controlling the dispensing units. Also, each dispensing unit 14, 16 can be configured with a z-axis sensor to detect a height at which the dispensing unit is disposed above the electronic substrate 12 or above a feature mounted on the electronic substrate. The z-axis sensor is coupled to the controller 18 to relay information obtained by the sensor to the controller.

Prior to performing a dispensing operation, as described above, the electronic substrate, e.g., the printed circuit board, must be aligned or otherwise in registration with a dispensing unit of the dispensing system. The dispensing system further includes a vision system 30, which, in one embodiment, is coupled to a vision system gantry 32 movably coupled to the frame 20 for supporting and moving the vision system. In another embodiment, the vision system 30 may be provided on the dispensing unit gantry 24. As described, the vision system 30 is employed to verify the location of landmarks, known as fiducials, or components on the electronic substrate. Once located, the controller can be programmed to manipulate the movement of one or more of the dispensing units 14, 16 to dispense material on the electronic substrate.

Systems and methods of the present disclosure are directed to dispensing material onto an electronic substrate, e.g., a printed circuit board. The description of the systems and methods provided herein reference exemplary electronic substrates 12 (e.g., printed circuit boards), which are supported on the support 22 of the dispensing system 10. In one embodiment, the dispense operation is controlled by the controller 18, which may include a computer system configured to control material dispensing units. In another embodiment, the controller 18 may be manipulated by an operator. The controller 18 is configured to manipulate the movement of the vision system gantry 32 to move the vision system so as to obtain one or more images of the electronic substrate 12. The controller 18 further is configured to manipulate the movement of the dispensing unit gantry 24 to move the dispensing units 14, 16 to perform dispensing operations.

Embodiments of the present disclosure are directed to a strain wave gear drive assembly that is configured to tilt and rotate a dispensing unit of a dispensing system. offer alternative and competitive means to accurately dispense simultaneously on one or more electronic substrates or two or more patterns associated with a single electronic substrate. The methods disclosed herein further support the use of various types of dispensing units, including, but not limited to, auger, piston and jetting pumps.

Figure 2:
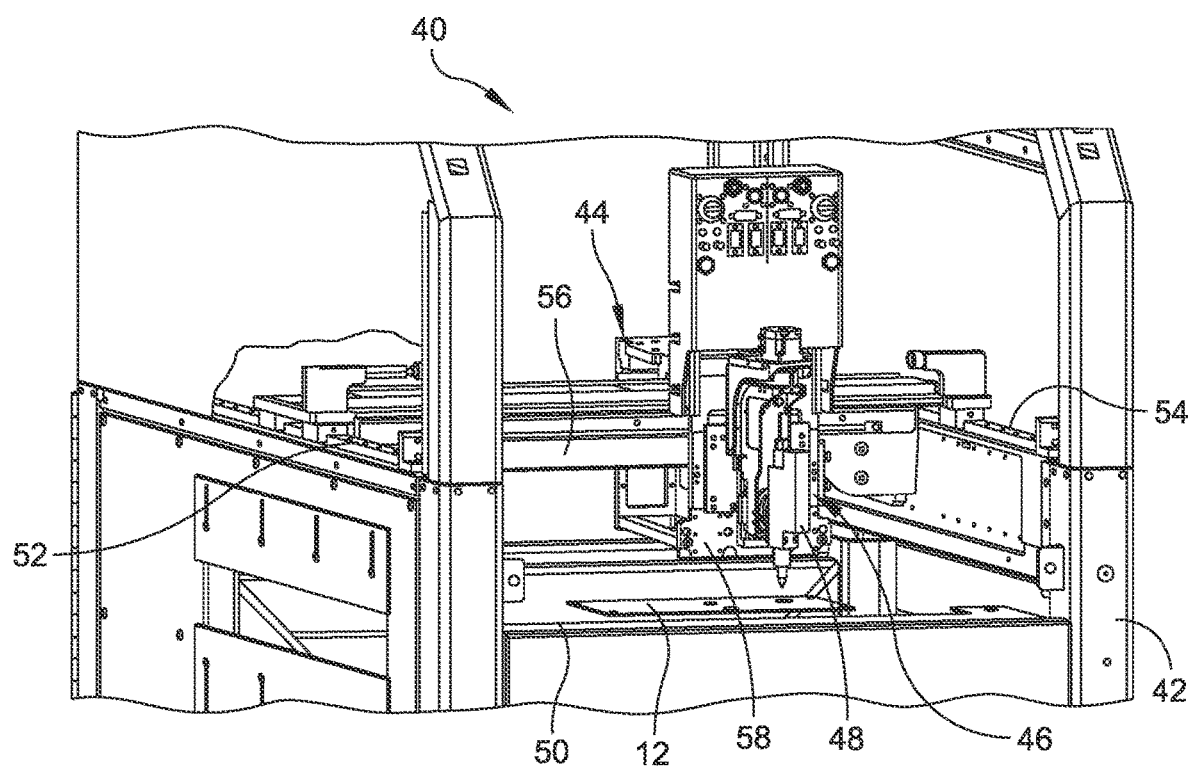
FIG. 2 is a perspective view of a dispensing system with packaging removed to disclose a dispensing system configured to manipulate a single dispensing unit.
Figure 3:
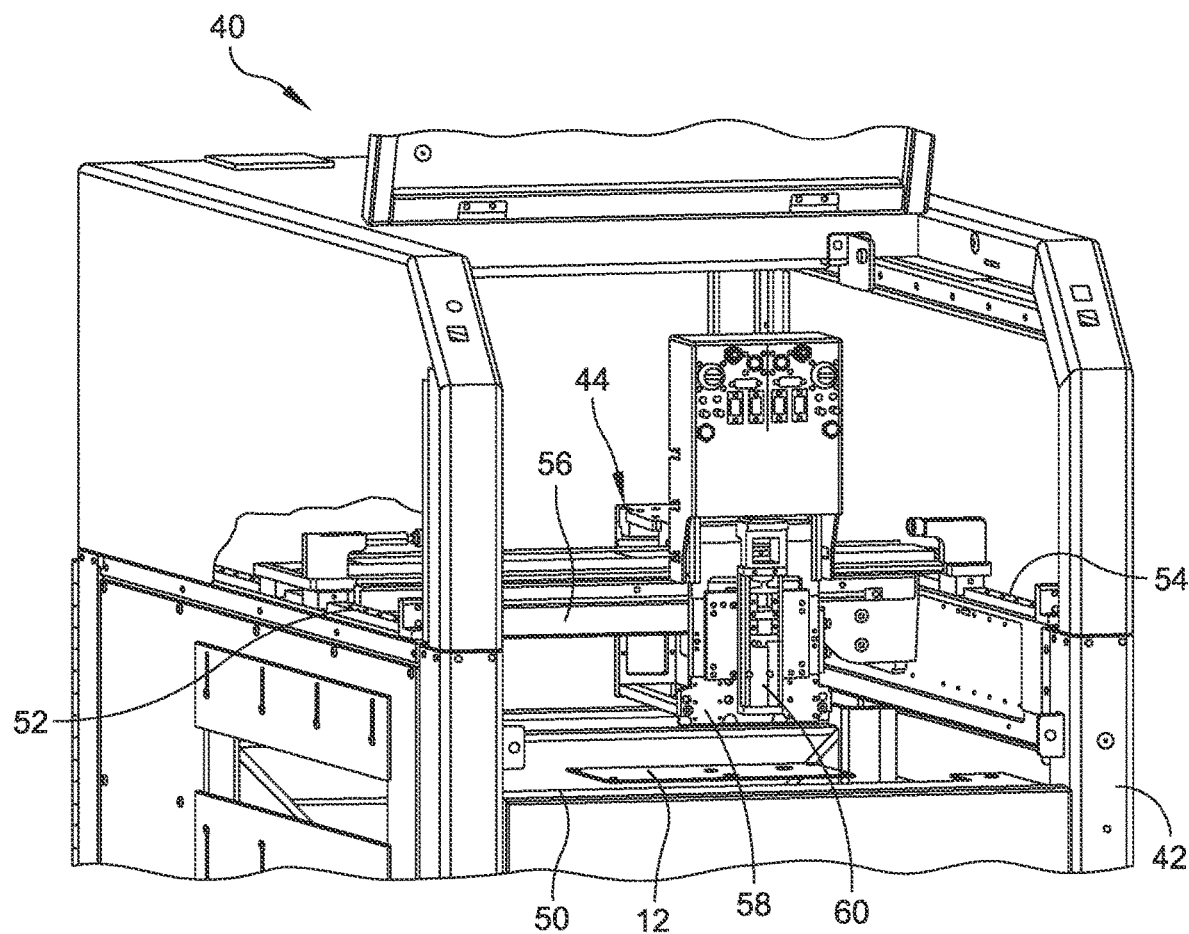
FIG. 3 is a perspective view of the dispensing system shown in FIG. 2 with the dispensing unit removed.

Referring to FIGS. 2 and 3, a dispensing system is generally indicated at 40. As shown, the dispensing system 40 includes a frame 42 configured to support the major sub-assemblies of the dispensing system. The dispensing system 40 further includes a gantry system, generally indicated at 44, which is configured to move in x-axis and y-axis directions. The dispensing system 40 further includes a dispensing unit assembly, generally indicated at 46, which is supported by the gantry system 44. FIG. 2 illustrates the dispensing system 40 having the dispensing unit assembly 46 and FIG. 3 illustrates the dispensing system 40 with the dispensing unit assembly removed. A conveyor system (not shown) may be used in the dispensing system 40 to control loading and unloading of substrates, e.g., electronic substrate 12, to and from a support 50 of the dispensing system. The gantry system 44 can be moved using motors under the control of a controller, in a manner similar to controller 18 of dispensing system 10, in the x-axis and y-axis directions to position the dispensing unit assembly 46 at predetermined locations over the electronic substrate.

In one embodiment, as shown in FIGS. 2 and 3, the gantry system 44 may be configured to include a left-hand side rail 52, a right-hand side rail 54, and a beam 56 that extends between the two side rails. The beam 56 is configured to move in a y-axis direction along the side rails 52, 54 to achieve y-axis movement of the dispensing unit assembly 46. The gantry system 44 further includes a carriage 58 that is coupled to the beam 56 and configured to move along a length of the beam to provide x-axis movement of the dispensing unit assembly 46. Specifically, the carriage 58 supports the dispensing unit assembly 46, and is configured to move along the length of the beam in the x-axis direction to move the dispensing unit 48 over desired locations of the electronic substrate 12 positioned on the support 50 of the dispensing system 40. In a certain embodiment, movement of the gantry system 44 (i.e., movement of the beam 56 and the carriage 58) in the x-y plane may be achieved by employing ball screw mechanisms driven by respective motors as is well known in the art.

In one embodiment, an exemplary dispensing system described herein may embody Camalot® dispensing systems sold by ITWEAE of Hopkinton, Massachusetts.

The dispensing unit assembly 46 is configured to move the dispensing unit 48 in a z-axis direction by a z-axis drive mechanism 60, which is shown in FIG. 2. The amount of z-axis movement may be determined by measuring the distance between the tip of a nozzle, sometimes referred to as a needle (not shown), of the dispensing unit 48 and the electronic substrate 12. When moving, the dispensing unit 48 may be positioned at a nominal clearance height above the electronic substrate 12. The clearance height may be maintained at a relatively consistent elevation above the electronic substrate 12 when moving from one dispense location to another dispense location. Upon reaching a predetermined dispense location, the z-axis drive mechanism 60 lowers the dispensing unit 48 to the electronic substrate 12 so that dispensing of material on the electronic substrate may be achieved.

Still referring to FIGS. 2 and 3, the dispensing unit 48 is moved over the electronic substrate 12 in such a manner to perform a dispense operation with the dispensing unit. However, prior to dispensing, the position of the electronic substrate 12 with respect to the dispensing unit 48 is determined so that accurate dispensing may take place. Specifically, in one embodiment, the carriage 58 can be configured to include an optical element or camera that is designed to take an image of the electronic substrate 12. Although the camera is described to be mounted on the carriage 58, it should be understood that the camera may be separately mounted on the beam 56 or on an independent gantry. The camera may be referred to herein as a "vision system" or an "imaging system." To align the electronic substrate 12 with the dispensing unit 48 and gantry system 44, images of at least two fiducials provided on the electronic substrate 12 are taken by the camera. If the electronic substrate 12 is out of position, the gantry system 44 may be manipulated to account for the actual position of the electronic substrate. In one embodiment, the camera may be calibrated to determine a camera-to-needle offset distance for the dispensing unit 48. In another embodiment, vision alignment and clearance height sensing can be achieved with a laser or another calibrated distance measurement device.

A dispensing system typically has a dispensing unit oriented vertically and thus perpendicular to a horizontally fixtured substrate. In some applications, it is advantageous to tip the dispensing unit away from the vertical to deposit the material being dispensed in a location that would otherwise be inaccessible from the vertical orientation. As the tilted dispensing unit is articulated to various desired orientations, it may also be advantageous to change not only the angle of the dispensing unit from the vertical, but also the direction in which the dispensing unit is tilted, perhaps to deposit material at the bottom edge of a part along more than one side.

As will be appreciated by those familiar with moving structures, the mechanisms utilized to tilt and rotate the dispensing unit 48 add mass and reduce the structural stiffness, since any added mechanism introduces addition compliance. As the supported mass is increased and the stiffness of the structure is reduced, the natural frequency of the assembly is lowered. Accordingly, it is incumbent upon the designer to provide the necessary degrees of freedom with a minimum of added mass and as stiff as structure as possible.

Embodiments of the dispensing system 40 of the present disclosure accomplish this goal by incorporating a very compact and highly integrated rotary actuator, such as those available from Harmonic Drive of Beverly, Massachusetts, that includes a motor, a strain-wave harmonic reduction gear box and a very stiff rotary cross-roller bearing. The high level of integration in the strain-wave gear-box actuator serves to minimize added mass and compliance. The strain-wave gear-box further has the benefit of extremely low backlash. Also, the integrated motor, bearing and gear-box assembly serves to minimize the number of parts that must be purchased, assembled and tested.

Figure 4:
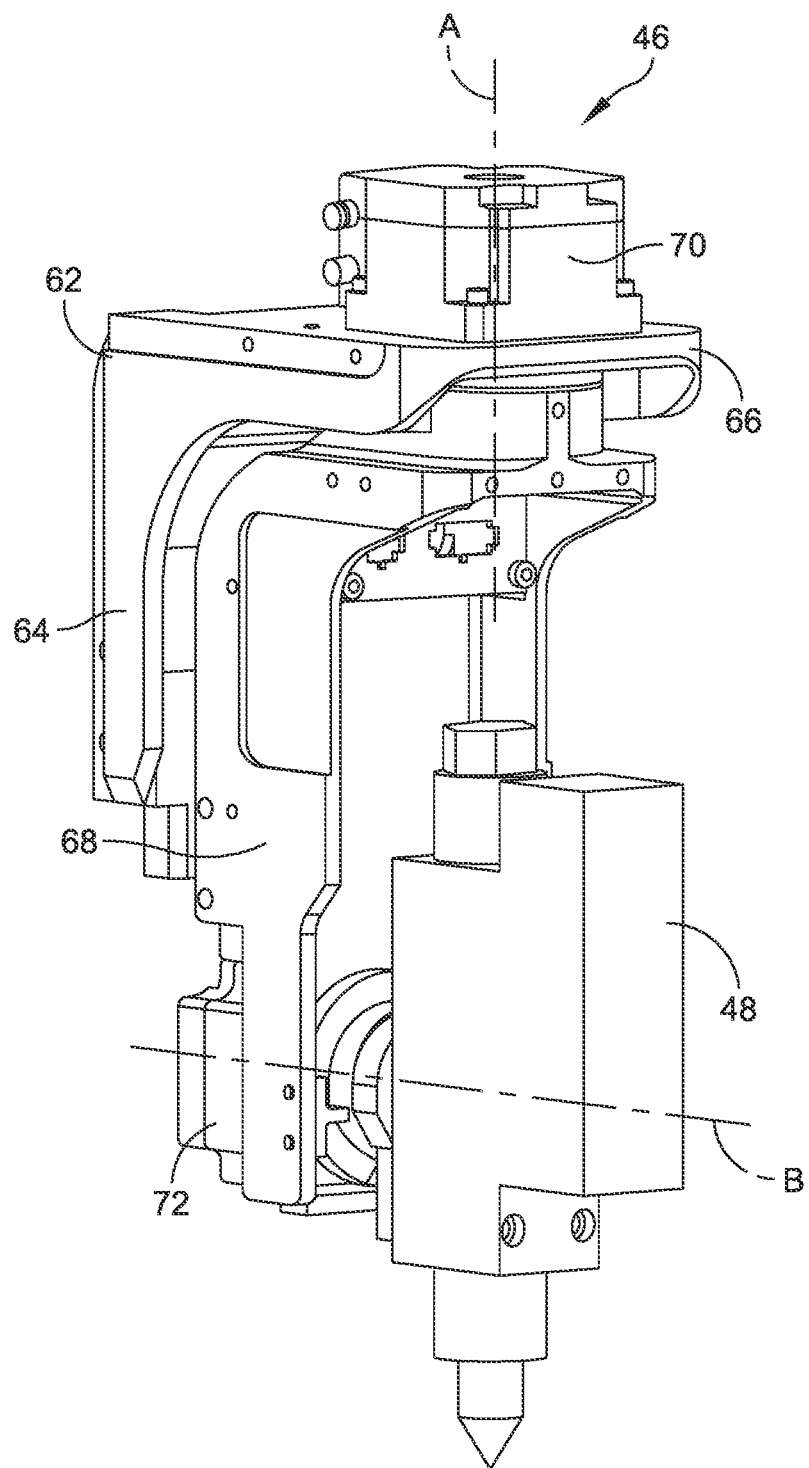
FIG. 4 is an enlarged perspective view of the dispensing system.
Figure 5:
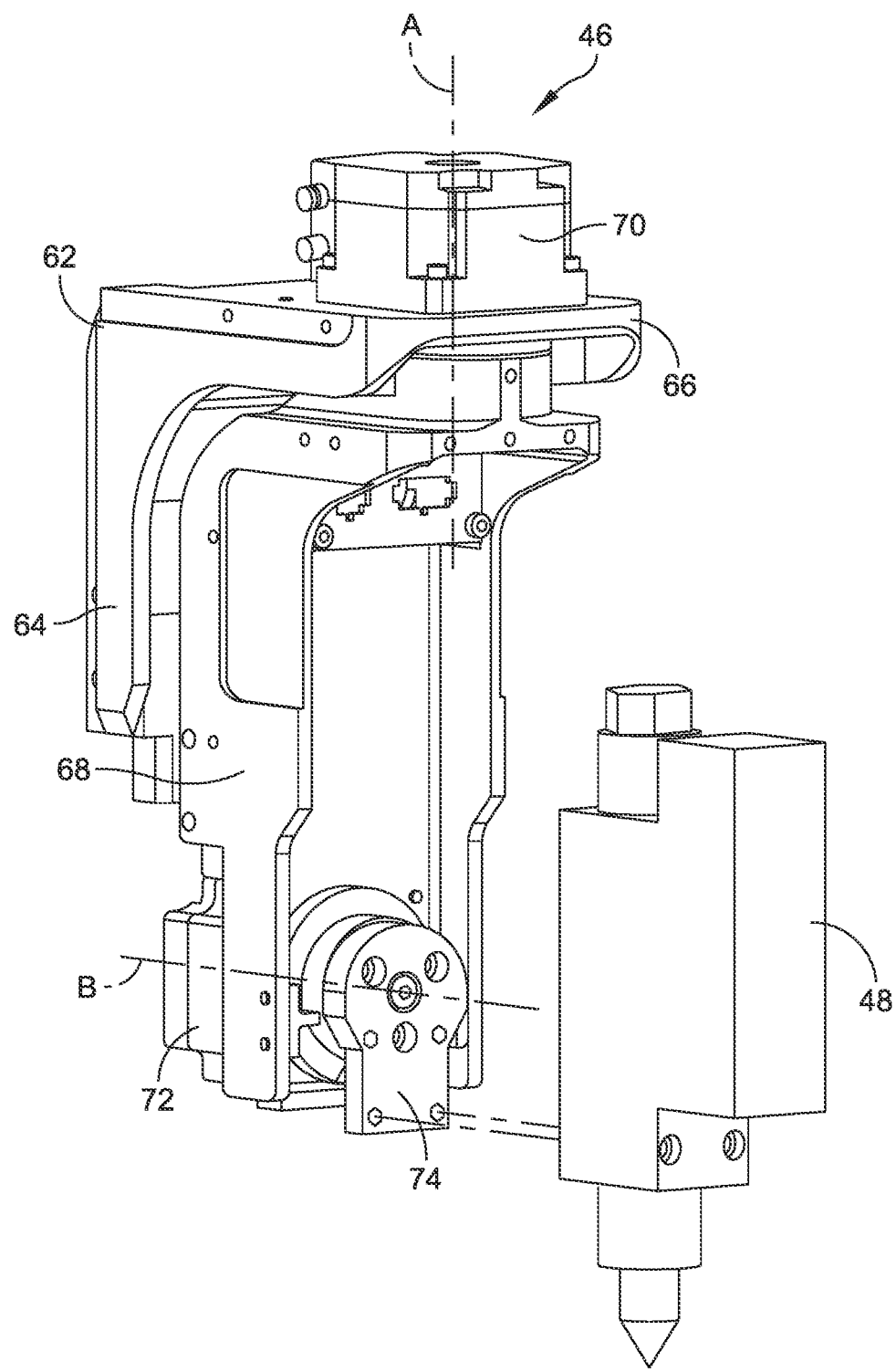
FIG. 5 is an enlarged perspective view of the dispensing system shown in FIG. 4 with the dispensing unit spaced from the remaining components of the dispensing system.

Referring to FIGS. 4 and 5, the dispensing unit assembly 46 includes a drive assembly configured to support the dispensing unit 48, which is shown in an operational position in FIG. 4 and a pre-operational position in FIG. 5 in which the dispensing unit is spaced from the components of the dispensing unit assembly configured to support the dispensing unit. As shown, the dispensing unit assembly 46 includes a support bracket 62 having an L-shaped construction in which a first portion 64 of the support bracket is secured to the z-axis drive mechanism 60 of the carriage 58 and a second portion 66 that extends perpendicularly from the first portion. The dispensing unit assembly 46 further includes a movable bracket 68 that is rotatably coupled to the support bracket 62 at the second portion 66 of the support bracket by a first strain wave gear system 70. In the shown embodiment, the movable bracket 68 is configured to rotate with respect to the support bracket 62 about a generally vertical axis A.

The movable bracket 68 includes a second strain wave gear system 72 that is configured to support the dispensing unit 48. As shown, the second strain wave gear system 72 includes a mounting plate 74 that is configured to receive and support the dispensing unit 48 when the dispensing unit is in its operational position. The second strain wave gear system 72 is configured to rotate and tilt the dispensing unit 48 to a desired position during a dispense operation about an axis B, which is generally perpendicular to axis A. In one embodiment, the first strain wave gear system 70 is similarly if not identically constructed as the second strain wave gear system 72.

It should be understood that the orientation of the movable bracket 68 with respect to the support bracket 62 about axis A and the orientation of the dispensing unit 48 with respect to the movable bracket can be varied to accommodate a particular application. For example, the movable bracket 68 can be rotatably coupled to the support bracket 62 about a generally horizontal axis and the dispensing unit can be rotatably coupled to the movable bracket about a generally vertical axis.

Figure 6:
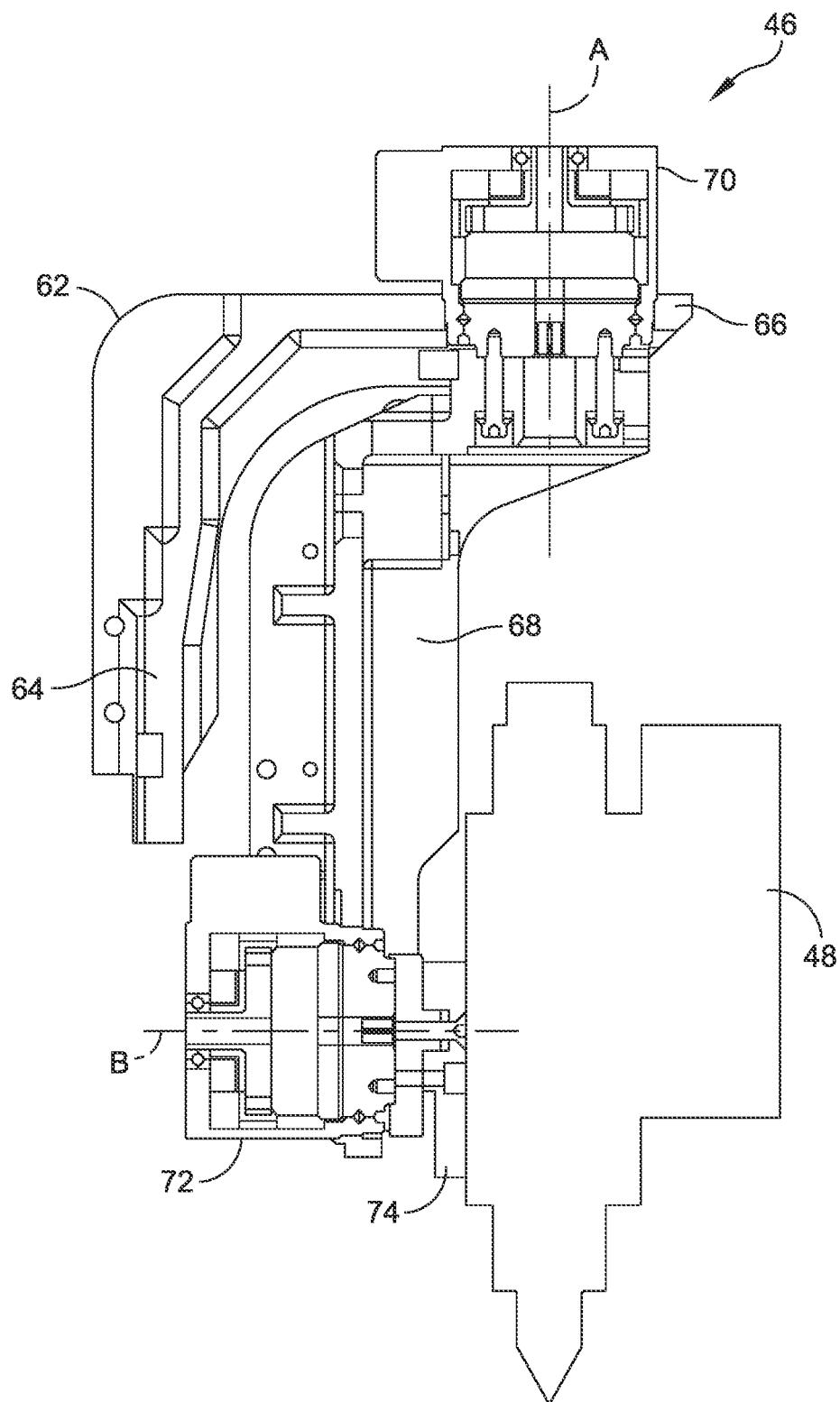
FIG. 6 is cross sectional view of the dispensing system.

FIG. 6 illustrates a cross-sectional view of the dispensing unit assembly 46 showing the first strain wave gear system 70 and the second strain wave gear system 72. The movable bracket 68 is configured to rotate with respect to the support bracket 62 up to an entire 360-degrees, i.e., 0 to 360 degrees. Similarly, the dispensing unit 48 is configured to rotated with respect to the movable bracket 68 up to an entire 360 degrees, i.e., 0 to 360 degrees. Thus, the amount of rotation and tilting of the dispensing head 48 is unrestricted.

In one embodiment, the controller or control system, such as controller 18, may be configured to have a suitable operating system, with application-specific software to control the operation of the dispensing system 40. In a certain embodiment, an operator of the dispensing system 40 may operate the dispensing system either manually by manipulating a keyboard and a mouse provided with the control system or automatically by preprogramming the control system by means of the keyboard and mouse through the control system. The controller further is configured to analyze at least one image of the electronic substrate 12 to determine positions of the electronic substrate in x-axis, y-axis and theta directions, calculate rotational angles of the electronic substrate, and rotate the dispensing unit 48 to match an angle of the electronic substrate when performing a dispense operation.

During operation, when depositing material on a substrate, such as an electronic, the dispensing unit 48 of the dispensing unit assembly 46 is positioned proximate to the electronic substrate by manipulating the gantry system. The controller controls the automated movement of the dispensing unit 48 by manipulating the gantry system 44 to dispense material on the electronic substrate 12 by rotating the dispensing unit about the A and B axes. The controller, by means of controlling the operation of the gantry system 44 and the drive assembly, controls movement (linear and rotational) of the dispensing unit of the dispensing unit assembly 46.

Thus, it should be observed that the movable bracket 68 is configured to rotate with respect to the support bracket 62 an entire 360-degrees and the dispensing unit 48 is configured to rotated with respect to the movable bracket an entire 360 degrees. This enables the dispensing unit 48 to deposit material on hard-to-reach places on the electronic substrate 12. The dispensing system 40 disclosed herein employs a unique combination of drive assemblies to control a direction of the dispensing unit 48, having the benefit of increased speed and precision of dispensing applications.

Motion Control

As mentioned above, the dispenser of embodiments of the present disclosure may include dispensing units including, but not limited to, auger, piston and jetting dispensing units. The controller of the dispensing system, e.g., controller 18 of dispensing system 10, is configured to perform a dispense operation on the electronic substrate. Specifically, the controller is configured to control the movement of the vision system and the vision system gantry, e.g., vision system 30 and vision system gantry 32, to obtain an image of the electronic substrate, e.g., electronic substrate 12, and any components or packages mounted on the substrate. Referring to FIGS. 7A and 7B, an exemplary electronic substrate 80 includes a package 82 mounted on the electronic substrate. The package 82 can include any type of electronic component, such as an integrated circuit. Also shown is a nozzle 90 of the dispensing unit, e.g., dispensing unit 48, positioned with respect to an intersection or connection edge point of the package 82 and the electronic substrate 80.

As discussed above, it is desirable to deposit material on the electronic substrate 80 around a periphery of the package 82, and traditional vertical dispensing is inadequate in performing this function. However, with the dispensing system of embodiments disclosed herein, including dispensing system 40, the ability to tilt and rotate the dispensing unit can position the nozzle 90 of the dispensing unit to optimize a dispense operation around the package 82. Further, the dispensing system is configured to dispense material around packages or other components of varying shapes and sizes.

Once an image is obtained, the controller is configured to control the movement of the gantry, the first strain wave gear system and the second strain wave gear system, and the activation of the dispensing unit, to dispense material around the package 82 mounted on the electronic substrate 80. The speed of movement of the nozzle 90 of the dispensing unit is determined by the controller to partially achieve a desired amount or density of material dispensed on the electronic substrate.

In one embodiment, a tip of the nozzle 90 can be controlled to achieve or otherwise maintain a predetermined distance 100 from an intersection of a package 82 and the electronic substrate 80 while dispensing material around the package. Specifically, the controller is configured to control the dispensing unit gantry, e.g., gantry system 44, and the tilt and rotate subassembly, e.g., the first and second strain wave gear systems 70, 72, to position the tip of the nozzle 90 in such a manner that the tip maintains the predetermined distance 100 from an edge of the package 82 at the intersection of the package and the electronic substrate 80. As shown, the nozzle 90 of the dispensing unit is disposed at a predetermined angle by the second strain wave gear system. The tip of the nozzle 90 of the dispensing unit can be positioned by rotating the dispensing unit by controlling the first strain wave gear system with the controller. The arrangement is such that by rotating the dispensing unit while moving the dispensing unit with the gantry enables the tip of the nozzle of the dispensing unit to maintain the predetermined distance 100 from the intersection while transitioning from a straight side of the package 82, around a corner of the package, to a perpendicular straight side of the package. In certain embodiments, for example, the predetermined distance 100 is up to 5.0 mm. In another example, the predetermined distance 100 is between 0.025 and 1.0 mm.

In one embodiment, the nozzle 90 can be controlled to achieve or otherwise maintain the nozzle of the dispensing unit a predetermined angle 102 with respect to a horizontal plane of the electronic substrate 80. As discussed above, the angle 102 of the nozzle 90 of the dispensing unit can be optimized to position the tip of the nozzle 90 as close to the intersection of the package 82 and the electronic substrate 80. Although a perpendicular angle (90°) is shown between the package and the electronic substrate, the package may be shaped to extend at any angle from the electronic substrate. The second strain wave gear system can be controlled by the controller to achieve the predetermined angle 102. For example, the predetermined angle 102 can be between 0° and 90°. In another example, the predetermined angle 102 can be approximately 45°.

In one embodiment, the nozzle 90 can be controlled by the controller to achieve or otherwise move the nozzle of the dispensing unit at a constant speed with respect to the package 82. As mentioned above, the controller is configured to manipulate the gantry, the first strain wave gear system and the second strain wave gear system to position the tip of the nozzle 90 of the dispensing unit the predetermined distance 100 from the intersection of the package 82 and the electronic substrate 80. Further, the controller is configured to manipulate the second strain wave gear system to position the nozzle 90 of the dispensing unit at the predetermined angle 102 to optimize the position of the tip of the nozzle. The controller is configured to move the dispensing unit to move the nozzle 90 of the dispensing unit at a constant speed thereby assisting in ensuring that a desired amount or density of material is deposited on the electronic substrate 80 adjacent the package 82. The speed of the dispensing unit can be varied; however, a constant speed, especially during straight portions of the package is desired. For example, the constant speed is up to 1000 mm/second. In another example, the constant speed is between 20 mm/sec and 200 mm/sec.

Together, the space of the predetermined distance 100 of the tip of the nozzle 90 from the intersection of the package 82 and the electronic substrate 100, the predetermined angle 102 of the nozzle of the dispensing unit, and the speed of the dispensing unit, provide motion control to the dispensing unit. Controlling the motion of the tip of the nozzle 90 of the dispenser takes place along the x-axis, y-axis, and rotational axes, and is achieved by the gantry, the first strain wave gear system, and the second strain wave gear system with the controller. As mentioned above, the vision system can be used to obtain an image of the location of the package 82, with the controller being configured to determine a path for the nozzle 90 of the dispensing unit to dispense material around the package. The controller provides instructions for the gantry, the first strain wave gear system, and second strain wave gear system to control movement of the dispensing unit during the dispense operation.

As mentioned above, the size and shape of the package 82 may embody a variety of shapes and sizes. The controller is configured to control the movements of the dispensing unit by controlling the gantry, first strain wave gear system, and the second strain wave gear system of the dispensing system to perform dispense operations on packages and components provided on the electronic substrate 80.

In one embodiment, the controller is configured to simultaneously coordinate the movement of the gantry assembly, including the gantry, and the tilt and rotate subassembly, including the first strain wave gear system and the second strain wave gear system, to position and orient the nozzle of the dispensing unit a predetermined distance 100 and orientation 102 from the electronic substrate 80 while dispensing material along a three-dimensional path.

Flow Rate Control

It should be understood that the amount of material deposited by the dispensing unit of the dispensing system depends not only on motion control of the nozzle 90 of the dispensing unit but also on the flow rate of material dispensed by the dispensing unit. Specifically, with respect to flow rate, the pressure of material in the dispensing unit and the size of the opening of the nozzle 90 of the dispensing unit determines the flow rate of material from the dispensing unit. As mentioned above, the gantry, the first strain wave gear system, and the second strain wave gear system are controlled by controller to move the dispensing unit in such a manner that the tip of the nozzle 90 of the dispensing unit is precisely positioned with respect to the package. Based on the position of the tip of the nozzle 90 and the speed of the dispensing unit, the flow rate of material is precisely controlled by the controller to dispense a desired amount or density of material around the package 82 on the electronic substrate 80.

As mentioned above, flow rate is partially determined by the viscosity of the material being dispensed, the pressure of the material within the nozzle 90, and the diameter of the nozzle through which the material is dispensed. The dispensing unit can be configured to control the pressure of the material within the nozzle 90. The pressure of the material can be controlled within a chamber of the dispensing unit by applying pressurized air within the chamber. In some embodiments, the size of the opening of the nozzle 90 of the dispensing unit can be selected to achieve a desired flow rate. It is understood that as material flows through the nozzle 90 of the and a diameter of the nozzle decreases or increases, the flow rate of the material increases or decreases, respectively.

In one embodiment, the controller further is configured to dispense material from the nozzle 90 of the dispensing unit at a flow rate configured to deposit a desired amount or density of material on the electronic substrate. The flow rate is determined by the viscosity of the material being dispensed, the pressure of the material within the nozzle 90, and the diameter of the nozzle through which the material is dispensed. For example, the flow rate can be up to 2000 mg/sec. In another example, the flow rate can be between 0.05 mg/sec and 10 mg/sec.

Multiple Dispensing Units

As mentioned above, embodiments of the dispensing system may include two or more dispensing units that can be configured to accurately dispense simultaneously on one or more electronic substrates or two or more patterns associated with a single electronic substrate in a synchronous mode or an asynchronous mode. Specifically, if the electronic substrates are not properly aligned as determined by the controller, the dispensing system can switch from a synchronous mode in which two electronic substrates or patterns are to be dispensed upon to an asynchronous mode in which only one electronic substrate or pattern is dispensed upon. The methods disclosed herein further support the use of various types of dispensing pumps, including, but not limited to, auger, piston and jetting pumps.

An exemplary dispense operation for two substrates or for two substrate patterns may consist of the following steps: delivering a first electronic substrate pattern to a dispense position; delivering a second electronic substrate pattern to a dispense position; aligning the first electronic substrate pattern with a first dispensing unit; positioning the second dispensing unit a predetermined distance from the first dispensing unit; dispensing material from the first dispensing unit at desired locations on the first electronic substrate pattern; and dispensing material from the second dispensing unit at desired locations on the second electronic substrate pattern. In certain embodiments, the step of dispensing material from the first dispensing unit may comprise lowering the first dispensing unit toward the first electronic substrate pattern. Similarly, the step of dispensing material from the second dispensing unit may comprise lowering the second dispensing unit toward the second electronic substrate pattern.

Another exemplary dispense operation may consist of the following steps: delivering first and second electronic substrate patterns to respective dispense positions; positioning a first dispensing unit over the first electronic substrate pattern; positioning a second dispensing unit a predetermined distance from the first dispensing unit; dispensing material from the first dispensing unit at desired locations on the first electronic substrate pattern; and dispensing material from the second dispensing unit at desired locations on the second electronic substrate pattern. Dispensing material from the first dispensing unit comprises lowering the first dispensing unit toward the first electronic substrate pattern. Similarly, dispensing material from the second dispensing unit comprises, lowering the second dispensing unit toward the second electronic substrate pattern. In certain embodiments, the predetermined distance is determined by identifying a first point of reference associated with the first electronic substrate pattern and a second point of reference associated with the second electronic substrate pattern.

Yet another exemplary dispense operation for two substrates may consist of the following steps: (1) calibrating the actual distance between each of the dispensing units and the camera; (2) identifying the actual positions of the fiducial locations on a substrate or on multiple substrates; (3) moving the first dispensing unit to a first dispense location on a first substrate; (4) dispensing at the first dispense location on the first substrate; (5) moving the second dispensing unit to the first dispense location on the second substrate, which is a small and therefore rapidly performed movement; (6) dispensing at the first dispense location on the second substrate; and (7) repeating steps (3) through (6) for each of the remaining dispense locations on the substrates. The foregoing operation may be performed when dispensing on a single substrate having multiple patterns on the substrate.

It is further contemplated that when using more than two dispensing units, that this approach of simultaneous dispensing on every other substrate may be employed. For example, when using three dispensing units, the first, third and fifth substrates may be dispensed upon simultaneously by the first, second and third dispensing units, respectively. After dispensing on these substrates, the dispensing units may be moved so that dispensing occurs on the second, fourth and sixth substrates with the first, second and third dispensing units, respectively.

In an exemplary embodiment, a method of dispensing material may include delivering an electronic substrate to a dispense position, the electronic substrate having at least two identical patterns, acquiring data relative to at least two patterns, determining whether the at least two patterns are properly suited for simultaneous dispensing to perform simultaneous dispense operations on the at least two patterns based on the acquired data, and performing simultaneous dispense operations on the at least two patterns if the two patterns are properly suited for simultaneous dispensing.

Dispensing material may include positioning a first dispensing unit over a first location of a first pattern and positioning a second dispensing unit over a first location of a second pattern. As discussed above, the second dispensing unit may be spaced from the first dispensing unit a predetermined distance. Specifically, material may be dispensed from the first and second dispensing units on respective first locations of the first and second patterns. Once dispensing takes place, the first dispensing unit is moved over a second location of the first pattern and the second dispensing unit is simultaneously moved over a second location of the second pattern of the electronic substrate. Once moved, material may be dispensed from the first and second dispensing units on respective second locations of the first and second patterns.

In another exemplary embodiment, a method of dispensing material may include (1) identifying positions of more than one location on an electronic substrate, (2) determining whether a dispense location of a first pattern and a dispense location of a second pattern are properly suited for simultaneous dispensing to perform simultaneous dispense operations on the first and second patterns based on the identified positions, (3) moving a first dispensing unit to a dispense location on the first pattern and a second dispensing unit to a dispense location on the second pattern, the dispense location of the first pattern corresponding with the dispense location on the second pattern, (4) dispensing at the first dispense location on the first pattern with the first dispensing unit and at the first dispense location on the second pattern with the second dispensing unit, and (5) repeating steps (3) and (4) for each remaining dispense location on the first and second patterns of the electronic substrate. As discussed above, prior to performing the method, a distance between the first dispensing unit and the camera and the distance between the second dispensing unit and the camera may be calibrated.

In one embodiment, to make a static one-time adjustment per substrate presented to the dispenser, the vision system and the controller locates and calculates the distance of one part in a substrate to another part in the same substrate, as well as any rotation of the substrate relative to the gantry system, and adjust the second dispensing unit one time prior to dispensing simultaneously. In another embodiment, an automatic adjustment mechanism may be utilized to make dynamic adjustments while dispensing. Thus, when two patterns are not properly suited for simultaneous dispensing, or in instances in which two substrates are not properly suited for simultaneous dispensing, the method includes simultaneously performing a first dispense operation on the first pattern (or substrate) with the first dispensing unit and performing a second dispense operation on the second pattern (or substrate) with the second dispensing unit. This may be achieved by dynamically positioning the second dispensing unit with the automatic adjustment mechanism while continuing to dispense with the first and second dispensing units.

The dispenser of embodiments of the disclosure is capable of dispensing different patterns simultaneously. In such a method, the gantry carrying the dispensing units, as well as an automatic adjustment mechanism associated with the second dispensing unit (and/or the first dispensing unit), are manipulated to dispense different patterns simultaneously. With this method, lines dispensed by the first dispensing unit and the second dispensing unit may be drawn synchronously.

Accordingly, for a dispenser having multiple dispensing units, the distance and relative position of each of the multiple dispensing units may be configured to match the distance and relative spacing between each of the multiple substrates or components. After collecting and analyzing alignment information from an automatic vision alignment system, a first of the multiple dispensing units is positioned over a first dispense location on the first substrate or component. After performing a dispense operation, the gantry may be manipulated to make any required x-axis and y-axis plane position adjustment that may be necessary to align a second of the multiple dispensing units over the corresponding first dispensing location of the second of the multiple substrates or components. Since the distance and relative position between each of the multiple dispense units is substantially similar to, although not necessarily identical to, the distance and relative position between each of the multiple substrates or components, any such adjustment of the gantry will be very small and thus rapidly performed. Each of the remaining multiple dispense units may be similarly utilized to dispense material at the corresponding first dispense location on each of the remaining substrates or components before any large x-axis and y-axis gantry motion is required. However, if the number of substrates or components is greater than the number of dispense units, then the gantry may need to be repositioned to complete the dispensing operations on all of the substrates. The method is repeated to dispense each of the second and subsequent dispense locations. It should be understood that steps may be interchanged as may be dictated by either throughput or process improvements.

As discussed above, in one embodiment, the dispensing units may be mounted on separate z-axis drive mechanisms. This configuration enables the performance of independent operations when appropriate, including but not limited to dispensing, cleaning (as by an automatic needle/nozzle cleaner, for example), purging and calibration (either the x-axis or y-axis positions or the z-axis position). However, it should be noted that the dispenser may be particularly suited for non-contact dispensing, such as the streaming or jetting of material from the needle/nozzle. When configured for non-contact dispensing, the dispensing operation may be performed with the two (or more) dispensing units that are mounted on a single z-axis drive mechanism.

One embodiment of the present disclosure is directed to a method of dispensing between synchronous and asynchronous modes. As mentioned above, when employing a vision system to determine whether a substrate or multiple substrates are properly suited for simultaneous dispensing, or whether a pattern or multiple patterns are properly suited for simultaneous dispensing, when properly suited for simultaneous dispensing, the substrates or patterns can be synchronously dispensed on by the dispensing units by employing a synchronous mode of operation. However, when not properly suited for simultaneous dispensing, the substrates or patterns can be automatically asynchronously dispensed independently by employing an asynchronous mode of operation.

In some embodiments, the tilt and rotate subassembly is configured to tilt the dispensing unit up to 3600 and to rotate the dispensing unit up to 360°.

In some embodiments, the gantry further includes a z-axis drive mechanism to provide z-axis movement of the dispensing unit.

Computer System

Figure 8:
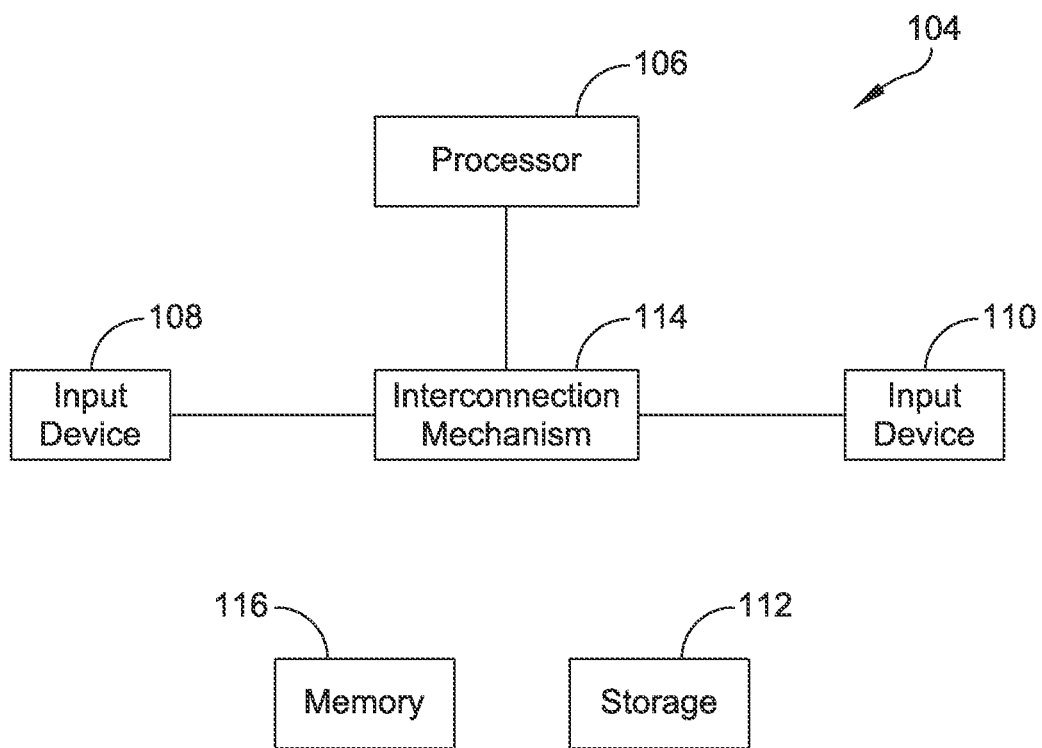
FIG. 8 shows an example computer system with which various aspects of the present disclosure may be practiced.
Figure 9:
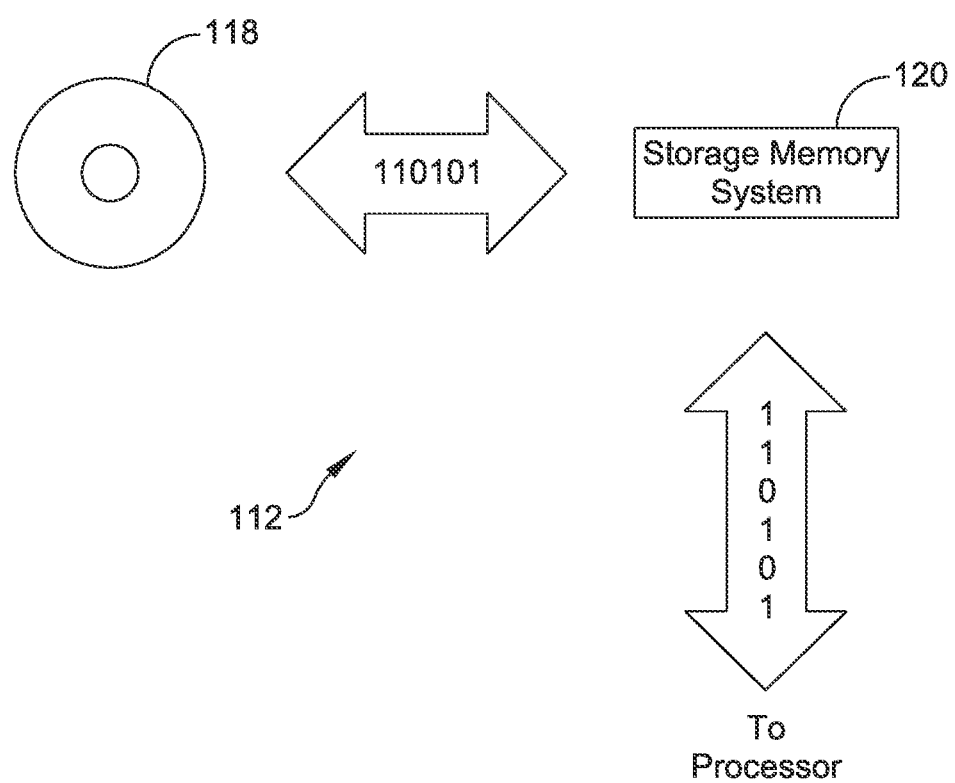
FIG. 9 shows an example storage system capable of implementing various aspects of the present disclosure.

A controller (e.g., controller 18), as described above, may be included in a computer system described below in relation to FIGS. 8 and 9. In particular, FIG. 8 shows an example computer system 104 used to implement various aspects of dispensing systems described herein (e.g., the dispensing system 40). FIG. 9 shows an example storage system that may be used.

System 104 is merely an illustrative embodiment of a computer system suitable for implementing various aspects of the invention. Such an illustrative embodiment is not intended to limit the scope of the invention, as any of numerous other implementations of the system, for example, are possible and are intended to fall within the scope of the invention. For example, a virtual computing platform may be used. None of the claims set forth below are intended to be limited to any particular implementation of the system unless such claim includes a limitation explicitly reciting a particular implementation.

Various embodiments according to the invention may be implemented on one or more computer systems. These computer systems may be, for example, general-purpose computers such as those based on Intel PENTIUM-type processor, Motorola PowerPC, Sun UltraSPARC, Hewlett-Packard PA-RISC processors, or any other type of processor.

It should be appreciated that one or more of any type computer system may be used to partially or fully automate integration of the recited devices and systems with the other systems and services according to various embodiments of the invention. Further, the software may be located on a single computer or may be distributed among a plurality of computers attached by a communications network. Such a communications network is utilized, in certain embodiments, to remotely control or remotely transfer information to/from the dispensing systems described herein.

Various aspects of the invention may be implemented as specialized software executing in a general-purpose computer system 104 such as that shown in FIG. 8. The computer system 104 may include a processor 106 connected to one or more memory devices 116, such as a disk drive, memory, or other device for storing data. Memory 116 is typically used for storing programs and data during operation of the computer system 104. Components of computer system 104 may be coupled by an interconnection mechanism 114, which may include one or more busses (e.g., between components that are integrated within a same machine) and/or a network (e.g., between components that reside on separate discrete machines). The interconnection mechanism 114 enables communications (e.g., data, instructions) to be exchanged between system components of system 104. Computer system 104 also includes one or more input devices 108, for example, a keyboard, mouse, trackball, microphone, camera, touch screen, and one or more output devices 110, for example, a dispensing unit, a motor, a camera, a printing device, display unit, touchscreen, and/or speaker. In addition, computer system 104 may contain one or more interfaces (not shown) that connect computer system 104 to a communication network (in addition or as an alternative to the interconnection mechanism 114).

The storage system 112, shown in greater detail in FIG. 9, typically includes a computer readable and writeable nonvolatile recording medium 118 in which signals are stored that define a program to be executed by the processor 106 or information stored on or in the medium 118 to be processed by the program. The medium 118 may, for example, be a disk or flash memory. Typically, in operation, the processor 106 causes data to be read from the nonvolatile recording medium 118 into another memory 120 that allows for faster access to the information by the processor than does the medium 118. This memory 120 is typically a volatile, random access memory such as a dynamic random-access memory (DRAM) or static memory (SRAM).

Data may be located in storage system 112, as shown, or in memory system 104. The processor 106 generally manipulates the data within the integrated circuit memory 116, 120 and then copies the data to the medium 118 after processing is completed. A variety of mechanisms are known for managing data movement between the medium 118 and the integrated circuit memory element 116, 120, and the invention is not limited thereto. The invention is not limited to a particular memory system 116 or storage system 112.

Although computer system 104 is shown by way of example as one type of computer system upon which various aspects of the invention may be practiced, it should be appreciated that aspects of the invention are not limited to being implemented on the computer system as shown in FIG. 8. Various aspects of the invention may be practiced on one or more computers having a different architecture or components than that shown in FIG. 8.

Computer system 104 may be a general-purpose computer system that is programmable using a high-level computer programming language. Computer system 104 may be also implemented using specially programmed, special purpose hardware. In computer system 104, processor 106 is typically a commercially available processor such as the Pentium, Core, Core Vpro, Xeon, or Itanium class processors available from the Intel Corporation. Many other processors are available. Such a processor usually executes an operating system which may be, for example, operating systems provided by Microsoft Corporation or Apple Corporation, including versions for PCs as well as mobile devices, iOS, Android OS operating systems, or UNIX available from various sources. Many other operating systems may be used.

Various embodiments of the present invention may be programmed using an object-oriented programming language, such as SmallTalk, Python, Java, C++, Ada, or C# (C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program, render aspects of a graphical-user interface (GUI) or perform other functions). Various aspects of the invention may be implemented using various Internet technologies such as, for example, the Common Gateway Interface (CGI) script, PHP Hyper-text Preprocessor (PHP), Active Server Pages (ASP), HyperText Markup Language (HTML), Extensible Markup Language (XML), Java, JavaScript and open source libraries for extending Javascript, Asynchronous JavaScript and XML (AJAX), Flash, and other programming methods. Further, various aspects of the present invention may be implemented in a cloud-based computing platform, such as the EC2 platform available commercially from Amazon.com (Seattle, WA), among others. Various aspects of the invention may be implemented as programmed or non-programmed elements, or any combination thereof.

Certain examples of a vision system or imaging system as described above include a camera (e.g., input device 108) having an image sensor configured to provide digital images and/or digital video to a computer system (e.g., the computer system 104) that operates a dispensing system as described herein (e.g., the dispensing system 40). One example of the image sensor is a complementary metal-oxide semiconductor (CMOS). The image sensor produces digital images or digital video frames including image features, such as the fiducials described above. The images produced by the sensor are processed (e.g., by the controller 18 or the processor 106) to carry out the functions of the dispensing system including camera calibration and determining a camera-to-needle offset distance for a dispensing unit (e.g., output device 110).

To operate a dispensing system as described herein, the processor 106 executes one or more software programs stored in the memory 116 and/or the storage 112. As an example, to control and operate dispensing mechanisms, motors, and other devices electronically connected to the computer system 104, a control loop may be provided. Such a control loop may be implemented by the processor 106 that executes the stored software to receive input data, such as images produced by the vision system and/or a status of a dispensing unit, processes the input data to determine an action, such as moving the dispensing unit to a particular location on a substrate, acquire new input data at a subsequent point in time, and then process the new data to determine a new position to move the dispensing head towards.

The stored software may also receive and/or provide information to a display unit (e.g., display unit 28) of the dispensing system. The display unit displays a GUI for interacting with a user to receive user inputs for modifying or selecting operations to be carried out with the dispensing system. In some examples, the display unit 28 is a touchscreen. In other examples, a user interacts with the GUI via a keyboard and mouse. The display unit in some examples provides status indications to the user as the dispensing operations progress. For example, the vision system may track progress of the dispensing unit as material is dispensed on a substrate and provide an indication of that progress on the display unit. In other examples, a predetermined point of dispensing progress may be reached and require user input, for example, and then the GUI prompts the user to confirm to proceed with subsequent motor and dispensing operations.

It is understood that the software functionalities described above are only examples and the computer system 104 is configured to control various additional aspects of the dispensing systems described herein.

In some embodiments, the controller can be configured with machine learning technology to develop algorithms to dispense material around identical packages and/or identical electronic substrates. As well-known in the art, machine learning technology is directed to techniques of data analysis that automates analytical model building. Machine learning technology is a subset of artificial intelligence based on the idea that systems can learn from data, identify patterns and make decisions without or with minimal human intervention.

Calibration

In some embodiments, a table can be provided having numerous orientations, e.g., up to or greater than 20. Each position is nearly infinitely definable within the resolution of the encoders, e.g., up to 1111 counts per degree. Each orientation can be identified to include a predefined camera to needle calibration, with each calibration containing a variable set by the operator, e.g., tilt, rotate and dispense height, as these define where the dispensed material will land on the electronic substrate a predetermined orientation. These orientations can be retrieved from a program and used to dispense at the given location based on vision and z-axis sense data. Numerous orientations may be used throughout a program to achieve a desired outcome.

Though each orientation has its own camera to needle calibration, it is not necessary to actually dispense at each orientation to determine these calibrations. Once a smaller number of orientations are calibrated by dispense and locate with vision, other can be interpolated to complete the calibrations.

For example, orientations with the same tilt and dispense height only need two to three rotate positions to interpolate all other rotate positions having the same tilt and dispense height.

In one embodiment, the controller further is configured to calibrate the dispense location of the nozzle of the dispensing unit with respect to the vision system by dispensing on the electronic substrate provided on the support. The controller can include or otherwise communicate with a database having a table of nozzle to vision system orientations. Specifically, the controller can be configured to calibrate the orientation of the nozzle based on in part an interpolation of known positions and orientations.

As used herein, "properly suited for simultaneous dispensing" means that the two or more substrates or patterns are located at known locations as determined by the controller after examining data associated with one or more images taken by the vision system or camera, with such known locations being within a predetermined tolerance, and no other acquired data indicates a reason not to dispense on one or more of the substrates or patterns.

As used herein, "acquired data" means data generated internal to the dispense system, such as vision data or transferred from an external source based on previous processing.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A dispensing system for dispensing viscous material on an electronic substrate, the dispensing system comprising:
   a frame;
   a support coupled to the frame, the support being configured to receive and support an electronic substrate during a dispense operation;
   a dispensing unit configured to dispense viscous material including solder paste, the dispensing unit having a nozzle;
   a gantry assembly coupled to the frame, the gantry assembly including a gantry configured to support the dispensing unit and to move the dispensing unit in x-axis, y-axis and z-axis directions and a tilt and rotate subassembly configured to tilt and rotate the dispensing unit; and
   a controller configured to control dispensing unit and the gantry assembly to perform a dispense operation to dispense viscous material on the electronic substrate, the controller being configured to simultaneously coordinate the movement of the gantry assembly in the x-axis, y-axis and z-axis directions and the tilt and rotate subassembly to position and orient the nozzle of the dispensing unit a predetermined distance and orientation from the electronic substrate while dispensing material along a three-dimensional path,
   wherein the predetermined distance is up to 5.0 mm,
   wherein the controller further is configured to move the nozzle of the dispensing unit at a constant speed with respect to a component mounted on the electronic substrate, the controller being configured to move the nozzle to achieve a constant speed of 1000 mm/second, and
   wherein the controller further is configured to dispense material from the nozzle of the dispensing unit at a flow rate configured to deposit a desired amount or density of material on the electronic substrate, the controller being configured to dispense material from the nozzle to achieve a flow rate of 2000 mg/second.

2. The dispensing system of claim 1, wherein the controller further is configured to maintain the nozzle of the dispensing unit a predetermined angle with respect to a horizontal plane of the electronic substrate.

3. The dispensing system of claim 2, wherein the predetermined angle is between 0° and 90°.

4. The dispensing system of claim 1, wherein the tilt and rotate subassembly is configured to tilt the dispensing unit up to 360° and to rotate the dispensing unit up to 360°.

5. The dispensing system of claim 1, further comprising a vision system coupled to one of the frame and the gantry assembly to capture at least one image of the electronic substrate.

6. The dispensing system of claim 5, wherein the controller further is configured to control the vision system.

7. The dispensing system of claim 6, wherein the controller further is configured to calibrate the dispense location of the nozzle of the dispensing unit with respect to the vision system by dispensing on the electronic substrate provided on the support.

8. The dispensing system of claim 7, wherein the controller includes or has access to a database having a table of nozzle to vision system orientations.

9. The dispensing system of claim 8, wherein the controller is configured to calibrate the orientation of the nozzle based on in part an interpolation of known positions and orientations.

10. The dispensing system of claim 1, wherein the gantry includes a support bracket and a movable bracket that is rotatably coupled to the support bracket by a first strain wave gear system, the movable bracket being configured to rotate with respect to the support bracket about a generally vertical axis.

11. The dispensing system of claim 10, wherein the movable bracket includes a second strain wave gear system that is configured to support the dispensing unit, the second strain wave gear system being configured to rotate and tilt the dispensing unit to a desired position during a dispense operation about an axis, which is generally perpendicular to the generally vertical axis.

12. A method of dispensing viscous material on an electronic substrate with the dispensing system of claim 1, the method comprising:
    delivering an electronic substrate to a dispense position in the dispensing system;
    capturing at least one image of the electronic substrate;
    analyzing the at least one image of the electronic substrate to determine a position of the electronic substrate; and
    performing a dispense operation by moving, tilting and rotating the dispensing unit coupled to the gantry configured to support the dispensing unit and to move the dispensing unit in x-axis, y-axis and z-axis directions and the tilt and rotate subassembly configured to tilt and rotate the dispensing unit,
    wherein performing the dispense operation includes simultaneously coordinating the movement of the gantry assembly and the tilt and rotate subassembly to position and orient a nozzle of the dispensing unit the predetermined distance and orientation from the electronic substrate while dispensing material along a three-dimensional path.

13. The method of claim 12, wherein performing the dispense operation includes maintaining the nozzle of the dispensing unit at a predetermined angle with respect to a horizontal plane of the electronic substrate.

14. The method of claim 12, wherein performing the dispense operation includes moving the nozzle of the dispensing unit at a constant speed with respect to the package.

15. The method of claim 12, wherein performing the dispense operation includes dispensing material from the nozzle of the dispensing unit at a flow rate configured to deposit a desired amount or density of material on the electronic substrate.

16. The method of claim 12, further comprising calibrating the dispense location of the nozzle of the dispensing unit with respect to the vision system of the dispenser by dispensing on the electronic substrate provided on the support.

17. The dispensing system of claim 16, wherein the controller includes or has access to a database having a table of nozzle to vision system orientations.

* * * * *